United States Patent [19]

Konishi

[11] 4,149,266

[45] Apr. 10, 1979

[54] DISCRIMINATION OF BUBBLE STATE BY BUBBLE COLLAPSE

[75] Inventor: Susumu Konishi, Miyouki, Japan

[73] Assignee: International Business Machines Corporation, Armonk, N.Y.

[21] Appl. No.: 863,105

[22] Filed: Dec. 22, 1977

[51] Int. Cl.² .............................................. G11C 19/08
[52] U.S. Cl. ......................................... 365/7; 365/30; 365/33; 365/36
[58] Field of Search ................... 365/7, 30, 32, 36, 3

[56] References Cited

U.S. PATENT DOCUMENTS

| | | | |
|---|---|---|---|
| 3,996,577 | 12/1976 | Hsu | 365/30 |
| 4,068,220 | 1/1978 | Argyle | 365/30 |

OTHER PUBLICATIONS

IBM Technical Disclosure Bulletin-vol. 18, No. 4, Sep. 1975, pp. 1258-1261.

*Primary Examiner*—James W. MOffitt

*Attorney, Agent, or Firm*—Joseph E. Kieninger

[57] ABSTRACT

A method for detecting the wall state of a soft bubble based upon the collapse characteristics of the bubble domain on a layer of bubble domain supporting material is described. The method includes the step of exchange coupling a magnetic layer, for example, an ion-implanted layer, to the bubble supporting layer. An in-plane field is applied to the bubble supporting layer when Bloch lines are present in the bubble domains. The bias field and the pulse field are set at a level to form a range of pulse widths which are suitable for the discrimination of soft bubble domains having different wall states. A pulse is then applied for a time sufficient to collapse only the S=1 bubble and not the S=0 bubble. Thereby this method distinguishes S=0 bubbles having one pair of winding Bloch lines from S=1 bubbles having one pair of unwinding Bloch lines. This method also distinguishes S=1 bubbles having a clockwise chirality from S=1 bubbles having a counterclockwise chirality.

6 Claims, 5 Drawing Figures

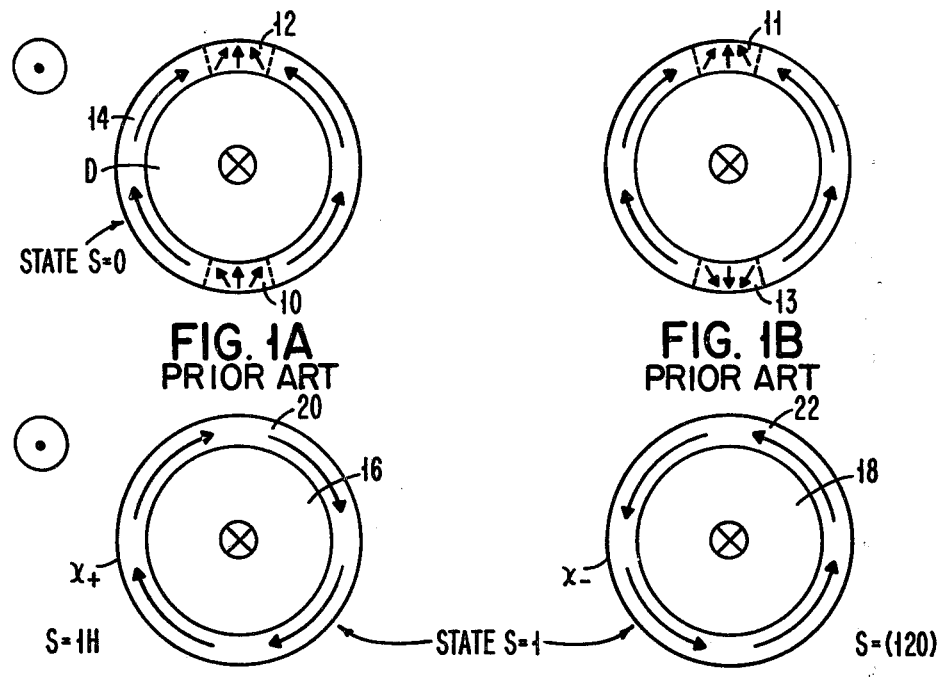
FIG. 1A PRIOR ART
FIG. 1B PRIOR ART
FIG. 2 PRIOR ART
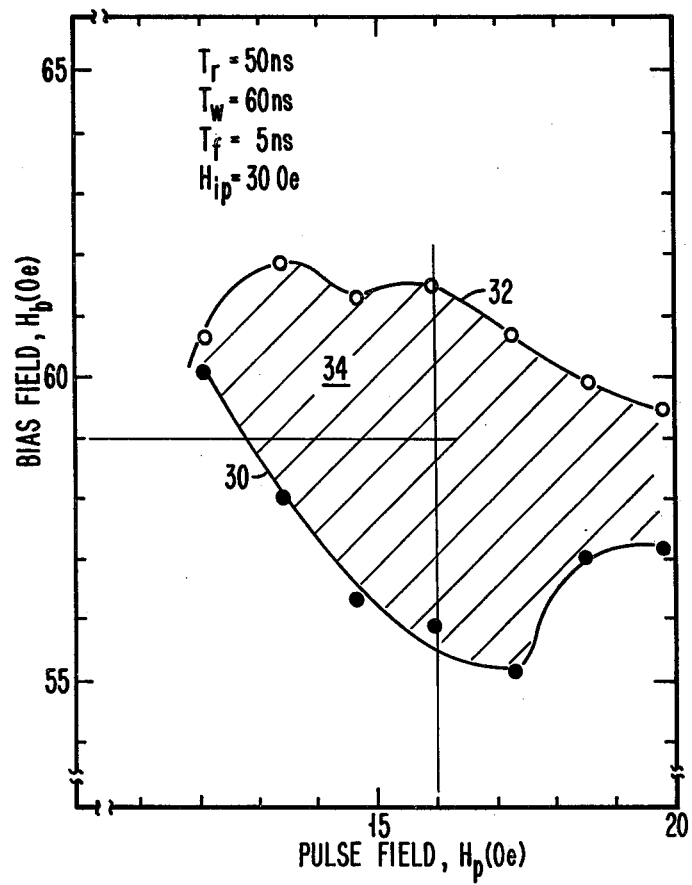
FIG. 4

DISCRIMINATION OF BUBBLE STATE BY BUBBLE COLLAPSE

FIELD OF THE INVENTION

This invention relates to magnetic bubble domains and more particularly to a method for determining the wall state of soft bubbles.

BRIEF DESCRIPTION OF PRIOR ART

In most of the prior art information storage systems using single wall magnetic bubble domains, data bits are generally represented by the presence or absence of bubble domains. In the bubble lattice storage system as set forth in U.S. Pat. No. 4,052,710 and assigned to the assignee of the present invention, the information is recorded as a difference in the wall structure of the different bubbles. Typically the data would be represented by bubbles having an $S=0$ wall state with one pair of winding Bloch lines in the walls thereof or an $S=1$ bubble with no winding Bloch lines in the wall thereof.

A method for determining the wall state of soft bubbles is set forth in U.S. Pat. No. 3,890,605 which is assigned to the assignee of the present invention. This method observes the direction of motion of the bubble in a gradient magnetic field which is substantially parallel to an easy axis of the magnetization of the medium in which the bubble domains exist. The deflection of the bubble is in turn dependent on the number of rotations of the magnetic moments in the domain wall, that is, the total number and sign of the winding vertical Bloch lines present in the periphery of the domain. This method has been widely used for detection schemes for $S=0$ and $S=1$ bubbles in bubble lattice systems. This method however requires more space than desired in close packed lattice systems.

Another detection scheme which has been utilized for distinguishing between hard bubbles, that is, bubbles having from 10 to 1,000 Bloch lines therein, from soft bubble having a few or no Bloch lines is described in U.S. Pat. No. 3,899,779 which is assigned to the assignee of this invention and in the IBM Technical Disclosure Bulletin Vol. 16, No. 6, Nov. 1973, pages 1809 and 1810. The method described in these references involves applying an increasing bias field to the as grown bubble supporting layer until the collapses. collpases. Soft bubbles collapse at a lower bias field whereas hard bubbles collapse at a higher bias field.

While this method was suitable for distinguishing hard bubbles from soft bubbles, it was not suitable for distinguishing one soft bubble from another soft bubble in as grown bubble supporting layers.

Voegeli et al in an article entitled "Domain Formation and Associated Wall States" in the IEEE Transaction on Magnetics, Vol. MAG-9, No. 4, Dec. 1973, pages 617–621 shows that bubble collapse time for $S=1$ bubbles having no Bloch lines is unique from that of other soft bubbles in that the data are relatively reproducible. Data for soft bubbles containing Bloch lines are not as reproducible and have a substantial scatter. Voegeli et al applies a single pulse in an as grown film in the absence of an in-plane field.

Malozemoff in a paper entitled "Mobility of Bubbles with Small Numbers of Bloch Lines" in the J. Appl. Phys. Vol. 44, No. 11, Nov. 1973, pages 5080–5089 shows that the minimum collapse time for $S=0$ bubbles having 1 pair of Bloch lines is different than for $S=1$ bubbles having no Bloch lines. Malozemoff collapses his bubbles using a series of pulses in an as grown film in the absence of an in-plane field. Both the Voegeli et al article and the Malozemoff article show that the collapse times for $S=1$ bubbles is different than for soft bubbles containing Bloch lines, neither article provides a method in which the wall states of soft bubbles can be readily discriminated by a collapsing technique.

SUMMARY OF THE INVENTION

It is the primary object of this invention to provide an improved method for determining the wall state of soft bubbles.

It is still another object of this invention to provide a method to discriminate between $S=1$ bubbles having a pair of unwinding Bloch lines and $S=0$ bubbles having one pair of winding Bloch lines.

It is a further object of this invention to provide a method to discriminate between $S=1$ bubbles having a clockwise chirality from $S=1$ bubbles having a counterclockwise chirality.

It is a still further object of this invention to provide a method for discriminating bubbles which is suitable for use in close packed lattice systems.

These and other objects are accomplished by a method which includes a step of exchange coupling a magnetic layer to the bubble supporting layer. Preferably the exchange coupling is an ion-implanted layer although it can be a thin garnet film with planar magnetization or a thin nickel-iron alloy film. An in-plane field is applied to the bubble supporting layer when Bloch lines are present in the bubble domains. This step is necessary when discriminating between $S=0$ bubbles having one pair of winding Bloch lines, and $S=1$ bubbles having one pair of unwinding Bloch lines. When discriminating between $S=0$ bubbles and $S=1$ bubbles, the use of an in-plane field increases the difference in the observed results. The bias field and the pulse field are set at a level to form a range of pulse widths which are suitable for the discrimination of soft bubble domains having different wall states. A single collapse pulse with an appropriate pulse shape is applied to the bubble for a time sufficient to collapse the bubble. The length of the time the pulse is applied is an indication of the wall state of the bubble. This method also distinguishes $S=1$ bubbles having a clockwise chirality from $S=1$ bubbles having a counterclockwise chirality. When distinguishing between $S=1$ bubbles with different chiralities, the in-plane field is not used.

Other objects of this invention will be apparent from the following detailed description, reference being made to the accompanying drawings wherein various embodiments of the invention are shown.

BRIEF DESCRIPTION OF THE DRAWINGS

FIG. 1A shows domain walls of an $S=0$ soft bubble having one pair of winding Bloch lines.

FIG. 1B shows domain walls of an $S=1$ soft bubble having one pair of unwinding Bloch lines.

FIG. 2 shows domain walls of two different $S=1$ soft bubbles $\chi_+$ and $\chi_-$.

FIG. 4 illustrates the bias and pulse field required to collapse $S=1$ and $S=0$ bubbles.

DESCRIPTION OF THE ILLUSTRATIVE EMBODIMENTS

Figure 3:
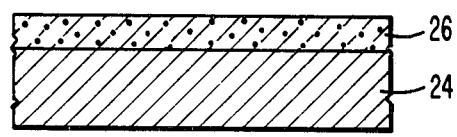
FIG. 3 is a cross-sectional view of the bubble medium and the exchange couple magnetic layer.

FIGS. 1A, 1B and 2 illustrate the wall states of the bubble domains presently being used in the bubble lattice memory systems. The bubble domain D of FIG. 1A has one pair of winding Bloch lines 10 and 12 within its domain wall 14. The bubble domain D of FIG. 1B has one pair of unwinding Bloch lines 11 and 13.

The bubble domains 16 and 18 of FIG. 2 have a magnetization normal to and pointing into the plane of the figure and have a Bloch wall 20 and 22, respectively. The two bubble domains 16 and 18 have a state $S=1$ with no Bloch lines. The bubble domain 16 has a clockwise direction of rotation of wall magnetization, that is, chirality, and is referred to as a $\chi_+$. The bubble domain 18 has a counterclockwise chirality and is called a $\chi_-$.

As shown in FIG. 3, the bubble domain supporting material layer 24 is typically a garnet material such as $Y_{1.95}Sm_{0.09}Lu_{0.09}Ca_{0.87}Ge_{0.87}Fe_{4.13}O_{12}$. The first step in the method is to provide an exchange coupling of a planar magnetic layer 26 to the bubble supporting layer 24.

The exchange coupled magnetic layer 26 can be any magnetic material having an inplane easy axis of magnetization capable of being exchange coupled to the bubble layer 24. Some examples of materials usable as the exchange coupled magnetic layer 26 are an ion-implanted layer, a magnetic garnet film, or a thin nickel-iron layer. A preferred exchange couple magnetic layer is an ion-implanted layer. An example of an ion-implanted layer is that obtained from ion-implanting the garnet material described above with 200 KeV neon ions at a dosage of $2 \times 10^{14}$ ions/cm$^2$. The static bubble collapse field of such an ion-implanted system is 90.3 Oe. The use of the exchange coupled magnetic layer is important and necessary in order for the method to provide a relatively large difference in the collapse properties of the bubbles having different wall states.

Bubbles are collapsed by using a conductor structure described in AIP Conference Proceedings No. 29, 69 (1975). In this method, a conductor loop is located between two parallel conductors. The bubble that is to be discriminated is moved to the center of the loop conductor by using the parallel conductors. A bias pulse if then applied to the bubble by sending a current pulse through the conductor loop.

In discriminating between $S=0$ and $S=1$ bubbles, an in-plane field is applied to the bubble domain containing film. The data illustrated in FIG. 4 were obtained by using the following conditions: a pulse width of 60 ns, a rise time of 50 ns, and a fall time of 5 ns, and an in-plane field of 30 Oe. In general, a slow rise time and a fast fall time for the applied pulse is preferred. In general, the in-plane field may vary from 10 to 100 Oe with the preferred range being 10 to 40 Oe. The material is an ion-implanted $(Y\,Sm\,Lu\,Ca)_3(Ge\,Fe)_5O_{12}$ film having bubbles with a diameter of about 5 $\mu$m. When the bias field and pulse field conditions are selected so as to fall below curve 30, neither the $S=0$ nor the $S=1$ bubbles will collapse. When the conditions fall above curve 32, both the $S=0$ and the $S=1$ bubbles will collapse. In accordance with this invention when the conditions fall within the cross hatched region 34, the application of the pulse field will cause the $S=1$ bubbles to collapse but will not collapse the $S=0$ bubbles.

Example No. 1

A bias field of 59 Oe and a pulse field of 16 Oe was applied to the bubbles individually. The $S=1$ bubbles collapsed. The $S=0$ bubbles did not collapse.

In discriminating between $S=1$ bubbles having a clockwise chirality, $\chi_+$, from $S=1$ bubbles having a counterclockwise chirality, $\chi_-$, an in-plane field is not present to insure the stability of the chirality of the bubbles. The data illustrated in FIG. 5 were obtained by using the following conditions; a pulse with a rise time of 10 ns, and a fall time of 5 ns and a bias field of 72.9 Oe. The material is an ion-implanted $(Y\,Sm\,Lu\,Ca)_3(Ge\,Fe)_5O_{12}$ film having bubbles with a diameter of about 5 $\mu$m. When the pulse field and pulse width are selected so as to fall below curve 36, neither the $\chi_+$ and the $\chi_-$ bubbles will collapse. When the conditions fall above curve 38, both the $\chi_+$ and the $\chi_-$ bubbles will collapse. In accordance with this invention when the conditions fall within the cross hatched region 40, the application of the pulse field will cause the $\chi_+$ bubbles to collapse but will not collapse the $\chi_-$ bubbles.

Example No. 2

A pulse field of 16 Oe and a pulse field of 110 ns was applied to the bubbles individually. The $\chi_+$ bubbles collapsed. The $\chi_-$ bubbles did not collapse.

Figure 5:
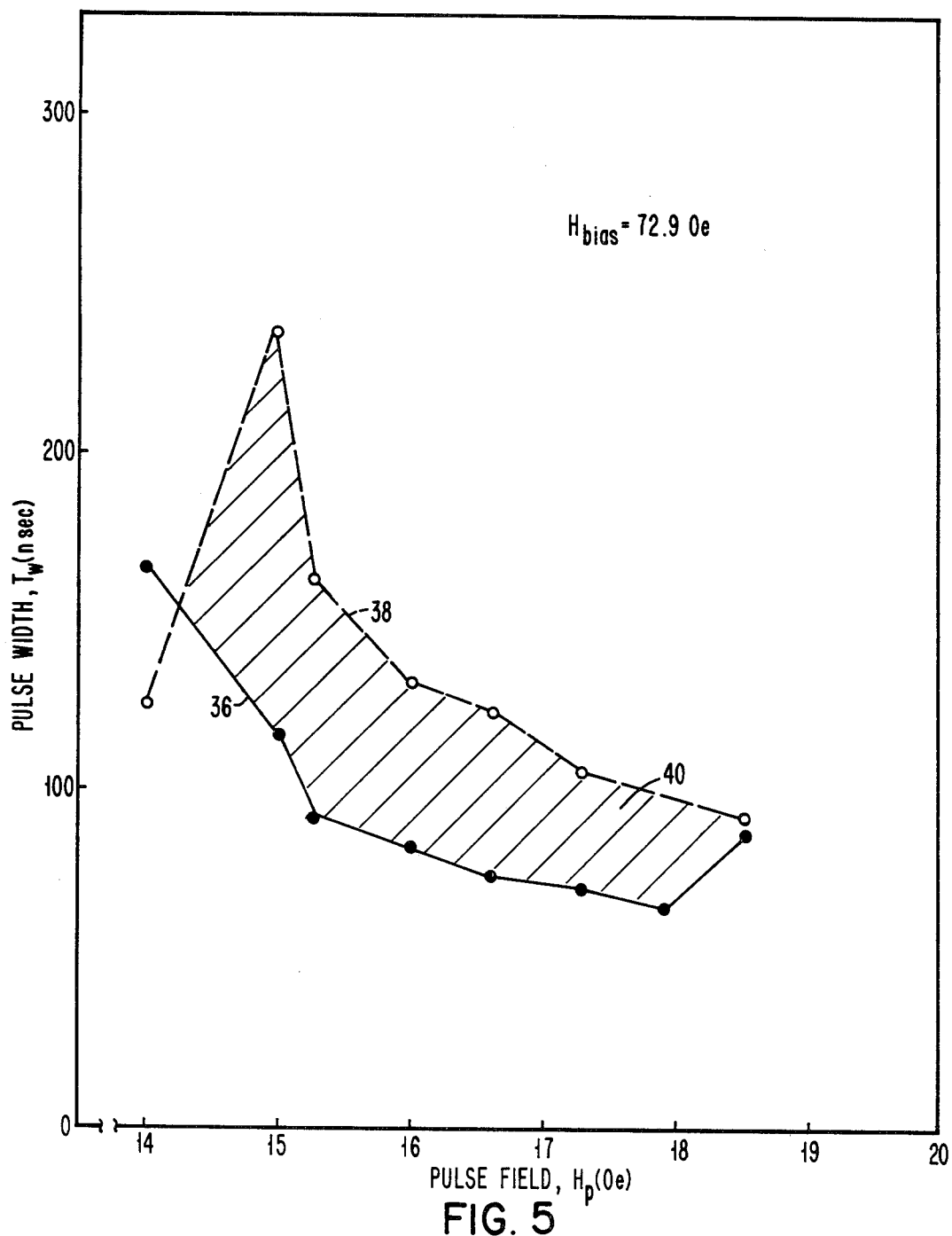
FIG. 5 illustrates the reciprocal collapse time and the pulse field for $S=1$ bubbles having a clockwise chirality, $\chi_+$ and $S=1$ bubbles having a counterclockwise chirality, $\chi_-$.

It is understood that the shape and relative position of the regions shown in FIGS. 4 and 5 where the bubble collapse characteristics are different may be changed by altering the operating conditions. Hence, the specific operating conditions set forth for the data shown in these figures do not limit the scope of this invention.

Although a preferred embodiment of this invention has been described, it is understood that numerous variations may be made in accordance with the principles of this invention.

What is claimed is:

1. A method of determining the wall state of a soft bubble domain in a layer of bubble domain supporting material comprising the steps of:
   exchange coupling a planar magnetic layer to said bubble domain supporting layer;
   applying a in-plane field to said bubble domain supporting layer when Bloch lines are present in the bubble domains; and
   setting the bias field and the pulse field to form a range of pulse widths suitable for the discrimination of soft bubble domains having different wall states, and
   applying a pulse for a time sufficient to give a width that falls within said range whereby soft bubbles of a first wall state will collapse and soft bubbles of a second wall state will not collapse.

2. A method as described in claim 1 whereby the step of exchange coupling a planar magnetic layer to said bubble supporting layer is performed by ion-implanting the layer to form a layer having inplane magnetization.

3. A method as described in claim 1 whereby the step of applying a pulse is carried out in the absence of an in-plane field being applied to said magnetic layer to discriminate between $S=1$ bubble domains having clockwise chirality and $S=1$ bubble domains having counterclockwise chirality.

4. A method as described in claim 1 whereby the step of applying a pulse is carried out in the presence of an in-plane field being applied to said supporting layer layer to discriminate between $S=0$ bubble domains having one pair of winding Bloch lines and S=1 bubble domains having one pair of unwinding Bloch lines.

5. A method as described in claim 1 whereby said strength of the in-plane field is between 10 to 100 Oe.

6. A method as described in claim 1 in which the bias field and pulse field are set to maximize the range of pulse width.

* * * * *

UNITED STATES PATENT AND TRADEMARK OFFICE
CERTIFICATE OF CORRECTION

PATENT NO. : 4,149,266
DATED : April 10, 1979
INVENTOR(S) : Susumu Konishi

It is certified that error appears in the above–identified patent and that said Letters Patent are hereby corrected as shown below:

Col. 4, lines 59 through 64:

3. [A method as described in claim 1 whereby the step of applying a pulse is carried out in the absence of an in-plane field being applied to said magnetic layer to discriminate between S=1 bubble domains having clockwise chirality and S=1 bubble domains having counterclockwise chirality.]

A method of determining the wall state of a soft bubble domain in a layer of bubble domain supporting material comprising the steps of:

exchange coupling a planar magnetic layer to said bubble domain supporting layer;

setting the bias field and the pulse field to form a range of pulse widths suitable for the discrimination of soft bubble domains having different S=1 wall states, and applying a pulse for a time sufficient to give a width that falls within said range whereby S=1 bubble domains having a clockwise chirality $\chi_+$, will collapse and S=1 bubble domains having a counterclockwise chirality $\chi_-$, will not collapse.

UNITED STATES PATENT AND TRADEMARK OFFICE
CERTIFICATE OF CORRECTION

PATENT NO. : 4,149,266

DATED : April 10, 1979

INVENTOR(S) : Susumu Konishi

It is certified that error appears in the above-identified patent and that said Letters Patent are hereby corrected as shown below:

Col. 4, line 68, delete the word "layer".

Signed and Sealed this

Seventeenth Day of July 1979

[SEAL]

Attest:

Attesting Officer

LUTRELLE F. PARKER

Acting Commissioner of Patents and Trademarks